United States Patent
Wu

[11] Patent Number: 5,986,305
[45] Date of Patent: Nov. 16, 1999

[54] SEMICONDUCTOR DEVICE WITH AN INVERSE-T GATE LIGHTLY-DOPED DRAIN STRUCTURE

[75] Inventor: Shye-Lin Wu, Hsinchu, Taiwan

[73] Assignee: Texas Instruments - Acer Incorporated, Hsinchu, Taiwan

[21] Appl. No.: 09/050,669

[22] Filed: Mar. 30, 1998

[51] Int. Cl.$^6$ ............................. H01L 29/76; H01L 29/94
[52] U.S. Cl. ......................... 257/344; 257/401; 257/408; 257/900
[58] Field of Search ................................... 257/900, 344, 257/401, 336, 327, 408

[56] References Cited

U.S. PATENT DOCUMENTS

| | | | |
|---|---|---|---|
| 5,182,619 | 1/1993 | Pfiester | 257/344 |
| 5,210,435 | 5/1993 | Roth et al. | 257/344 |
| 5,241,203 | 8/1993 | Hsu et al. | 257/344 |
| 5,304,504 | 4/1994 | Wei et al. | 437/44 |
| 5,739,573 | 4/1998 | Kawaguchi et al. | 257/900 |

OTHER PUBLICATIONS

Tiao–Yuan Huang et al., A New LDD Transistor with Inverse–T Gate Structure, IEEE Electron Device Letters, vol. EDL–8, No. 4, Apr. 1987, pp. 151–153.

Mizuki Ono et al., Sub–50 NM Gate Length N–Mosfets with 10 NM Phosphorus Source and Drain Junctions, 1993 IEEE, pp. 119–122.

Hyunsang Hwang et al., Performance and Reliability Optimization of Ultra Short Channel CMOS Device for Giga–bit DRAM Applications, 1995 IEEE, pp. 435–438.

*Primary Examiner*—Donald L. Monin, Jr.
*Attorney, Agent, or Firm*—Harness, Dickey & Pierce, P.L.C.

[57] ABSTRACT

An ultra-short channel device with an inverse-T gate lightly-doped drain (ITLDD) structure is disclosed. The present invention includes a semiconductor substrate, which includes a top surface; a source region formed in the semiconductor substrate; and a drain region formed in the semiconductor substrate spaced from the source region by a channel region. Further, the present invention also includes an inverse-T shaped silicon region formed over the semiconductor substrate, wherein the inverse-T shaped silicon region is approximately disposed within the area of the channel region; and a sidewall insulating region abutting to a sidewall of the inverse-T shaped silicon region. A first conductive region is formed on the top surface of the inverse-T shaped silicon region, and a second conductive region is formed on the top surface of the source region. Also, a third conductive region is formed on the top surface of the drain region.

10 Claims, 4 Drawing Sheets

SEMICONDUCTOR DEVICE WITH AN INVERSE-T GATE LIGHTLY-DOPED DRAIN STRUCTURE

BACKGROUND OF THE INVENTION

1. Field of the Invention

The present invention relates to a semiconductor transistor, and particularly, to an ultra-short channel metal-oxide-semiconductor field effect transistor (MOSFET) with an inverse-T gate lightly-doped drain (ITLDD) structure.

2. Description of the Prior Art

Metal-oxide-semiconductor (MOS) devices with ultra-short (less than 0.1 µm) channel are required for high frequency operation, for example, in a high-speed ring oscillator. The major constrains for 0.1 µm (or less) gate length metal-oxide-semiconductor field effect transistor (MOSFET) device used, for example, in giga-bit dynamic random access memories (DRAMs) are short channel effect and hot carrier reliability problems. To solve these problem, some process techniques such as ultrashallow junction and ultra-thin gate oxide are used. For example, a device design window of process conditions such as oxide thickness, punch-through doses, and lightly-doped drain (LDD) doses is disclosed in Hyunsang Hwang et al., "Performance and Reliability Optimization of Ultra Short Channel CMOS Device for Giga-bit DRAM Applications," IEEE IEDM Tech. Dig., pages 435–438 (1995) which is hereby incorporated by reference.

However, it becomes difficult to define a gate length below 0.1 µm due to some practical limitations, such as the resolution, under current optical photolithography technique. In order to circumscribe this situation, a resistor-thinning process based on an isotropic plasma resist ashing technique is applied in forming short channel MOSFETs with the gate length below 0.1 µm as disclosed in Mizuki Ono et al., "Sub-50 nm Gate Length N-MOSFETs with 10 nm Phosphorus Source and Drain Junctions," IEEE IEDM Tech. Dig., pages 119–122 (1993) which is also hereby incorporated by reference.

When the MOSFET devices are operated at a low supply voltage, the parasitic resistance effect due to the lightly-doped drain (LDD) structure should be reduced to maintain their performance. Further, the peak field location under the gate should be properly controlled, so that the hot carrier effect germane to the LDD structure can be improved. An inverse-T lightly-doped drain (ITLDD) transistor structure is disclosed in Tiao-Yuan Huang et al., "A New LDD Transistor with Inverse-T Gate Structure," IEEE Electronic Device Letters, VOL. EDL-8. No. 4, pages 151–153 (1987) which is hereby incorporated by reference. Although this ITLDD structure can alleviate hot carrier effect, its process is still not suitable for high-density or high-speed circuit application, in which fabrication of ultra-short channel devices with gate length less than 0.1 µm is required.

SUMMARY OF THE INVENTION

In accordance with the present invention, an ultra-short channel MOSFET with an inverse-T gate lightly-doped drain (ITLDD) structure is provided. In one embodiment, the present invention includes a semiconductor substrate, which includes a top surface; and a source region formed in the semiconductor substrate. Further, a drain region is formed in the semiconductor substrate spaced from the source region by a channel region. The drain region comprises a first doped portion adjacent the channel region and abutting to the top surface of the semiconductor substrate; and a second doped portion spaced from the channel region by the first doped portion and abutting to the top surface of the semiconductor substrate. Also, the present invention includes a first silicon oxide layer formed on the semiconductor substrate, the first silicon oxide layer being disposed over the channel region; and an inverse-T shaped silicon region formed on the first silicon oxide layer, wherein the inverse-T shaped silicon region is approximately disposed within the area of the first silicon oxide layer. A second silicon oxide sidewall insulating region abutting to a sidewall of the inverse-T shaped silicon region is provided, and a first silicide region is formed on the top surface of the inverse-T shaped silicon region. Finally, a second silicide region is formed on the top surface of the source region, and a third silicide region is formed on the top surface of the drain region.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
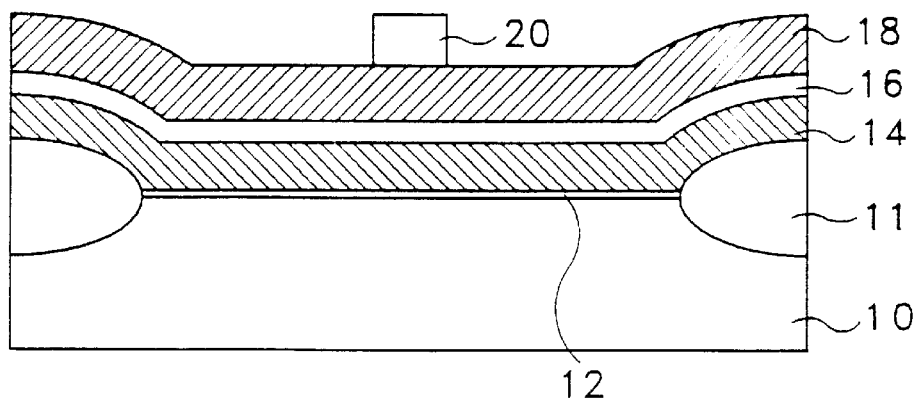
FIGS. 1–11 show cross-sectional views illustrative of various stages in the fabrication of an ultra-short channel MOSFET with an inverse-T gate lightly-doped drain (ITLDD) structure in accordance with the present invention.

FIG. 1 shows a cross-sectional view illustrative of a portion of a semiconductor substrate 10 having field oxide regions 11 thereon in accordance with one embodiment of the present invention, wherein a thin gate oxide layer 12 having thickness of about 15–150 angstroms is grown on the substrate 10, for example, in a conventional thermal furnace. Next, a polysilicon layer 14, such as an undoped polysilicon layer, amorphous silicon layer or stacked silicon layers, is deposited on the gate oxide layer 12, and is used for forming a portion of a gate structure, which will become clear after the embodiment is described in details. In this embodiment, this polysilicon layer 14 is preferably deposited using a conventional low pressure chemical vapor deposition (LPCVD). The thickness of this polysilicon layer 14 can range from about 1000 to 3000 angstroms.

Still referring to FIG. 1, a dielectric cap layer 16, such as a silicon nitride layer, is formed over the polysilicon layer 14 to a thickness of about 100 to 1000 angstroms. In this embodiment, the silicon nitride layer 16 is deposited using a conventional low pressure chemical vapor deposition (LPCVD) or plasma enhanced chemical vapor deposition (PECVD). A sacrificial semiconductor layer 18 is formed on the silicon nitride layer 16. In this embodiment, n+ doped polysilicon is preferably chosen as the material of this sacrificial layer 18, and is deposited using a standard chemical vapor deposition process to a thickness of about 500–3000 angstroms.

Figure 2:
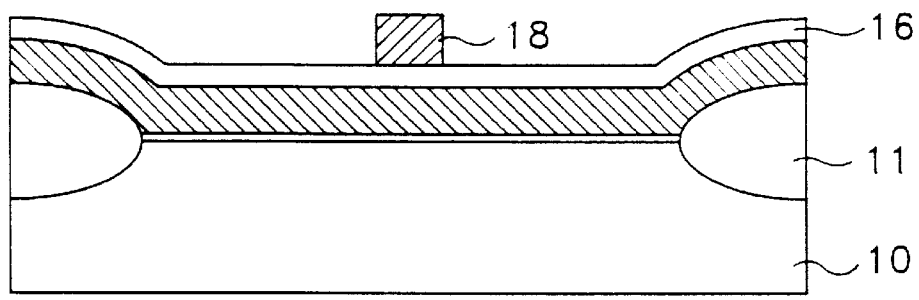

A photoresist layer 20 is then formed and patterned on the doped polysilicon layer 18 using conventional photolithography techniques, thereby defining a gate region in the doped polysilicon layer 18 after the doped polysilicon layer 18 is etched back as shown in FIG. 2.

Figure 3:
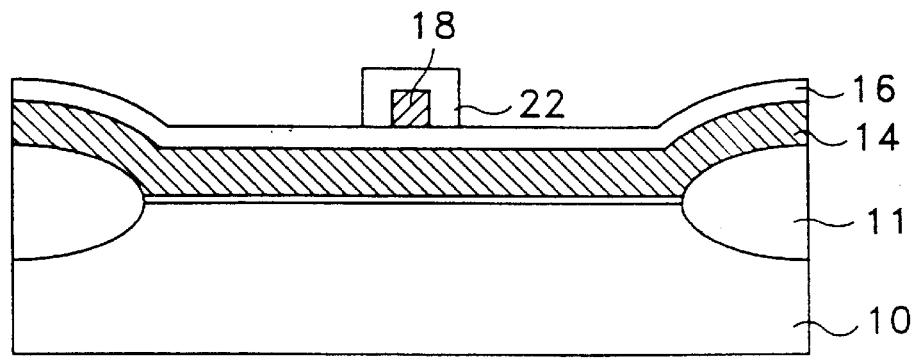

The patterned doped polysilicon layer 18 is then subjected to, for example, a low temperature (about 700–950° C.) steam oxidation process to oxidize the doped polysilicon layer 18, forming thermal polyoxide layer 22 into the doped polysilicon layer 18 along the sidewalls and top surface of the doped polysilicon layer 18 as shown in FIG. 3.

Figure 4:
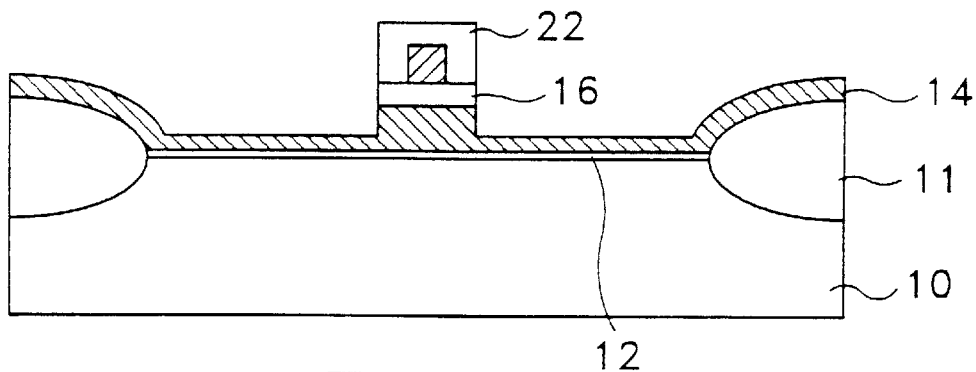

Using the thermal polyoxide layer 22 as a mask, the silicon nitride layer 16 is etched, and the undoped polysilicon layer 14 is partially etched, forming a cross section as shown in FIG. 4.

Figure 5:
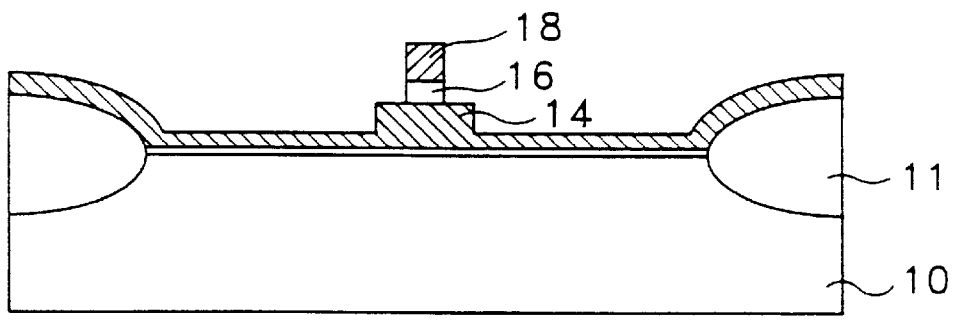
Figure 6:
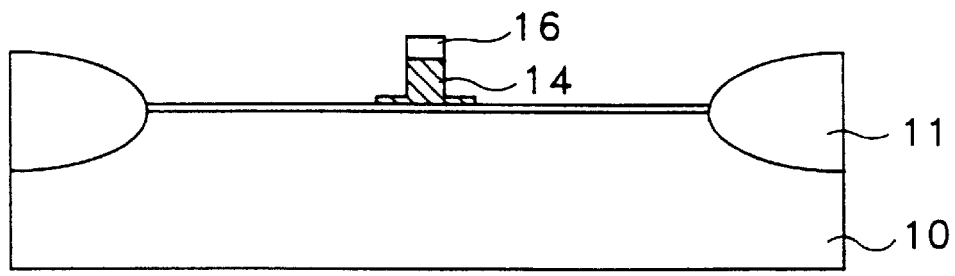
Figure 7:
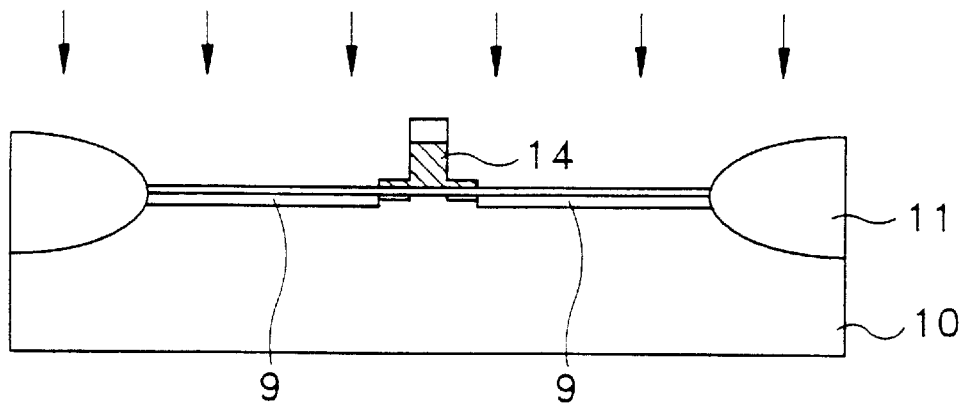

The thermal polyoxide layer 22 is then removed, for example, by diluted hydrofluoric (HF) solution or buffered oxide etch (BOE), wherein the remained undoped polysilicon layer 14 is used to protect the field oxide regions 11 and the gate oxide layer 12 from being effected. Subsequently, the silicon nitride layer 16 is etched using the doped polysilicon layer 18 as a mask, resulting in the cross section shown in FIG. 5. The formed silicon nitride layer 16 is further used as a mask to etch the undoped polysilicon layer 14, resulting in an inverse-T gate structure as shown in FIG. 6. The substrate 10 is then subjected to an ion implantation through the inverse-T gate structure, forming source/drain region 9 having a lightly-doped drain profile in the substrate 10 as shown in FIG. 7.

Figure 8:
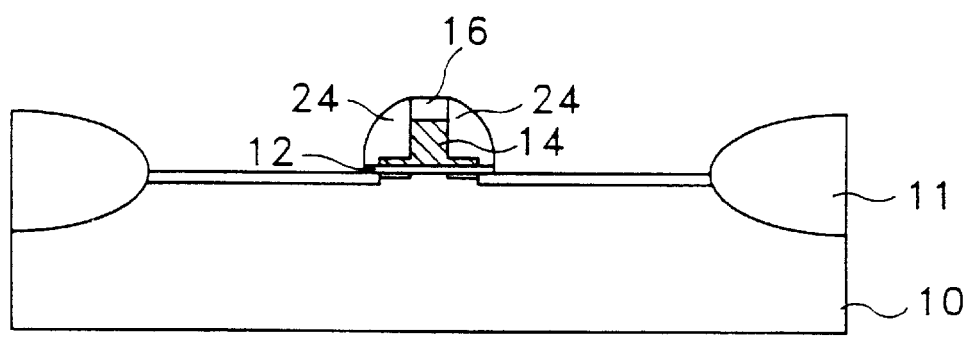

Referring to FIG. 8, a spacer 24 is formed on the sidewalls of the silicon nitride layer 16, the undoped polysilicon layer 14, and the gate oxide layer 12. In this embodiment, silicon oxide is chosen as the material of the spacer 24. This oxide spacer 24 is preferably formed by firstly blanket depositing a silicon oxide layer 24 by a chemical vapor deposition (CVD) over the structure of FIG. 7, followed by etching back this silicon oxide layer 24.

Figure 9:
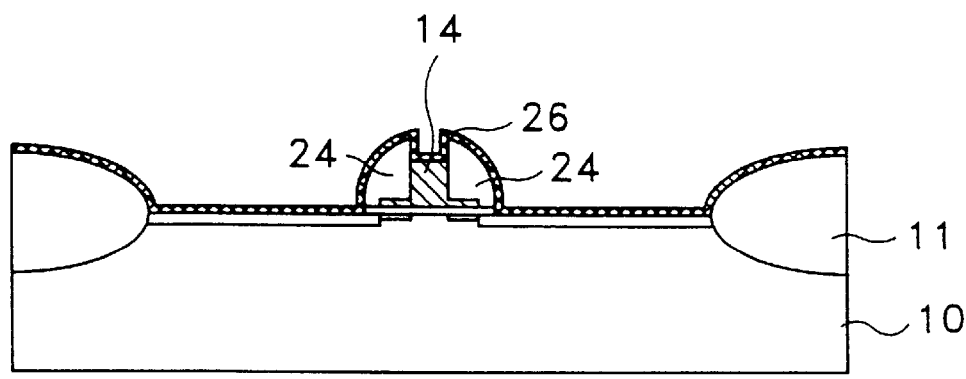

In FIG. 9, after the silicon nitride layer 16 is removed, a metal layer 26, such as Ti, Co, Pt, Ni, Cr, W, or Pd, is deposited over the exposed substrate 10, the spacer 24, and the undoped polysilicon layer 14 by sputtering or chemical vapor deposition (CVD).

Figure 10:
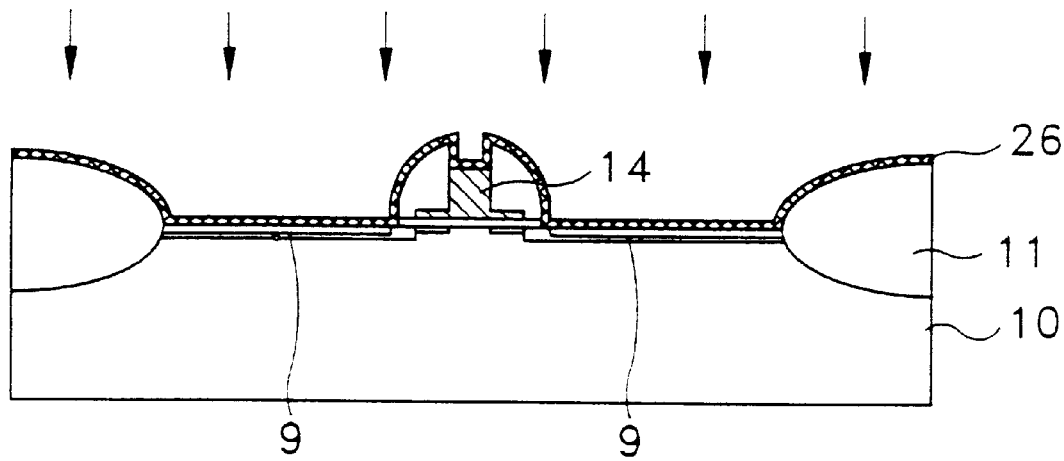

Referring to FIG. 10, the gate region in the undoped polysilicon layer 14, and the source/drain region 9 in the substrate 10 are then doped by a high dose (about $10^{14}$–$10^{16}$ atoms/cm$^2$) implant through the metal layer 26.

Figure 11:
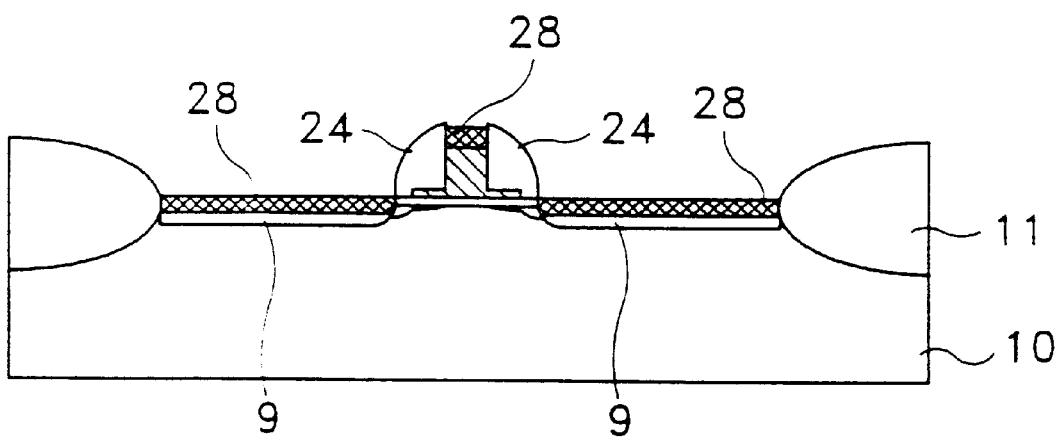

To complete the present invention, an annealing process is performed to form silicide regions 28 over the gate region 14 and source/drain region 9, therefore forming an ultra-short channel salicided MOSFET with an inverse-T gate lightly-doped drain (ITLDD) structure as shown in FIG. 11. In this embodiment, the annealing process is preferably a conventional two-step rapid thermal process (RTP). It is noted that the oxide spacer 24 previously formed in connection with FIG. 8 is used in the resultant MOSFET structure to prevent the silicide region 28 on the gate 14 from being electrically bridged to the silicide region 28 on the source/drain 9. It is appreciated that the term "ultra-short" in this specification is commonly used in semiconductor industry to refer to a channel width in the range of about 4–100 nm.

Although specific embodiments have been illustrated and described, it will be obvious to those skilled in the art that various modifications may be made without departing from the spirit which is intended to be limited solely by the appended claims.

What is claimed is:

1. A semiconductor device with an inverse-T gate lightly-doped drain (ITLDD) structure, said device comprising:
    a semiconductor substrate, including a top surface;
    a source region formed in said semiconductor substrate;
    a drain region formed in said semiconductor substrate spaced from said source region by a channel region;
    an inverse-T shaped silicon region formed over said semiconductor substrate, said inverse-T shaped silicon region being approximately disposed within area of said channel region, said inverse-T shaped silicon region including a pair of sidewalls and two arms, each of said arms including a first surface and a second surface;
    a sidewall insulating region abutting said sidewalls and said first and second surface of said arms of said inverse-T shaped silicon region;
    a first conductive region formed on a top surface of said inverse-T shaped silicon region;
    a second conductive region formed on a top surface of said source region; and
    a third conductive region formed on a top surface of said drain region.

2. The device according to claim 1, wherein said inverse-T shaped silicon region comprises polysilicon.

3. The device according to claim 1, wherein said inverse-T shaped silicon region comprises amorphous silicon.

4. The device according to claim 1, wherein said drain region comprising:
    a first doped portion adjacent said channel region and abutting to said top surface of said semiconductor substrate; and
    a second doped portion spaced from said channel region by said first doped portion and abutting to said top surface of said semiconductor substrate.

5. The device according to claim 1, further comprising a silicon layer disposed between said semiconductor substrate and said inverse-T shaped silicon region.

6. The device according to claim 1, wherein said sidewall insulating region comprises silicon oxide.

7. The device according to claim 1, wherein said first conductive region, said second conductive region, and said third conductive region comprise silicide.

8. A semiconductor device with an inverse-T gate lightly-doped drain (ITLDD) structure, said device comprising:
    a semiconductor substrate, including a top surface;
    a source region formed in said semiconductor substrate;
    a drain region formed in said semiconductor substrate spaced from said source region by a channel region, said drain region comprising:
        a first doped portion adjacent said channel region and abutting to said top surface of said semiconductor substrate; and
        a second doped portion spaced from said channel region by said first doped portion and abutting to said top surface of said semiconductor substrate;
    a first silicon oxide layer formed on said semiconductor substrate, said first silicon oxide layer being disposed over said channel region;
    an inverse-T shaped silicon region formed on said first silicone oxide layer, said inverse-T shaped silicon region being approximately disposed within area of said first silicon oxide layer, said inverse-T shaped silicon region including a pair of sidewalls and two arms, each of said arms including a first surface and a second surface;
    a second silicon oxide sidewall insulating region abutting said sidewalls and said first and second surface of said arms of said inverse-T shaped silicon region;
    a first silicide region formed on a top surface of said inverse-T shaped silicon region;
    a second silicide region formed on a top surface of said source region; and
    a third silicon region formed on a top surface of said drain region.

9. The device according to claim 8, wherein said inverse-T shaped silicon region comprises polysilicon.

10. The device according to claim 8, wherein said inverse-T shaped silicon region comprises amorphous silicon.

* * * * *